United States Patent
Cho

(10) Patent No.: US 9,859,892 B2
(45) Date of Patent: Jan. 2, 2018

(54) SEMICONDUCTOR APPARATUS REDUCING A PARASITIC CAPACITANCE

(71) Applicant: SK hynix Inc., Icheon-si, Gyeonggi-do (KR)

(72) Inventor: Sun Ki Cho, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/047,864

(22) Filed: Feb. 19, 2016

(65) Prior Publication Data
US 2017/0019107 A1    Jan. 19, 2017

(30) Foreign Application Priority Data
Jul. 13, 2015  (KR) .......................... 10-2015-0099380

(51) Int. Cl.
*H03K 3/01* (2006.01)
*H03K 19/0185* (2006.01)

(52) U.S. Cl.
CPC ............................ *H03K 19/018521* (2013.01)

(58) Field of Classification Search
CPC ............................................. H03K 19/018521
USPC ........................................................ 327/534
See application file for complete search history.

(56) References Cited

U.S. PATENT DOCUMENTS 5,448,198 A * 9/1995 Toyoshima .......... H01L 27/0218
257/E27.11
8,904,248 B2 * 12/2014 Park ..................... G06F 11/221
714/716
9,225,175 B2 * 12/2015 Kim ...................... H01L 27/088

FOREIGN PATENT DOCUMENTS

KR    1019970053848 A    7/1997
KR    1020020087266 A    11/2002
KR    1020040014742 A    2/2004

* cited by examiner

*Primary Examiner* — Kenneth B Wells
(74) *Attorney, Agent, or Firm* — William Park & Associates Ltd.

(57) ABSTRACT

A semiconductor apparatus may include a transmission circuit, a reception circuit, and a pad commonly coupled to the transmission circuit and the reception circuit. When either the transmission circuit or the reception circuit is activated, parasitic capacitance of a line coupled to the transmission circuit, the reception circuit, and the pad is varied.

19 Claims, 4 Drawing Sheets

SEMICONDUCTOR APPARATUS REDUCING A PARASITIC CAPACITANCE

CROSS-REFERENCES TO RELATED APPLICATION

This application claims priority under 35 U.S.C. 119(a) to Korean application No. 10-2015-0099380, filed on Jul. 13, 2015, in the Korean intellectual property Office, which is incorporated by reference in its entirety as set forth in full.

BACKGROUND

1. Technical Field

Various embodiments generally relate to a semiconductor integrated circuit, and more particularly, to a semiconductor apparatus.

2. Related Art

Semiconductor apparatuses may operate with external apparatuses by transmitting signals to the external apparatuses or receiving signals from the external apparatuses.

The semiconductor apparatus may include a transmission circuit for transmitting a signal to an external apparatus, and a reception circuit for receiving a signal from the external apparatus.

The semiconductor apparatus may use a transmission pad to transmit the signal to the external apparatus, and a reception pad to receive the signal from the external apparatus. The semiconductor apparatus may transmit and receive the signals to and from the external apparatus through one pad.

SUMMARY

According to an embodiment, there is provided a semiconductor apparatus. The semiconductor apparatus may include a transmission circuit, a reception circuit, and a pad. The pad may be commonly coupled to the transmission circuit and the reception circuit. When one of the transmission circuit and the reception circuit is activated, parasitic capacitance may be varied in a line coupled to the transmission circuit, the reception circuit, and the pad.

According to an embodiment, there is provided a semiconductor apparatus. The semiconductor apparatus may include a transmission circuit and a reception circuit commonly coupled to a pad. The semiconductor apparatus may include a transmission control circuit configured to generate a bulk control signal when one of the transmission circuit and the reception circuit is activated. The semiconductor apparatus may include a bulk control circuit configured to generate a first bulk voltage and a second bulk voltage in response to the bulk control signal. The first bulk voltage and the second bulk voltage may be provided to the transmission circuit.

DETAILED DESCRIPTION

Figure 1:
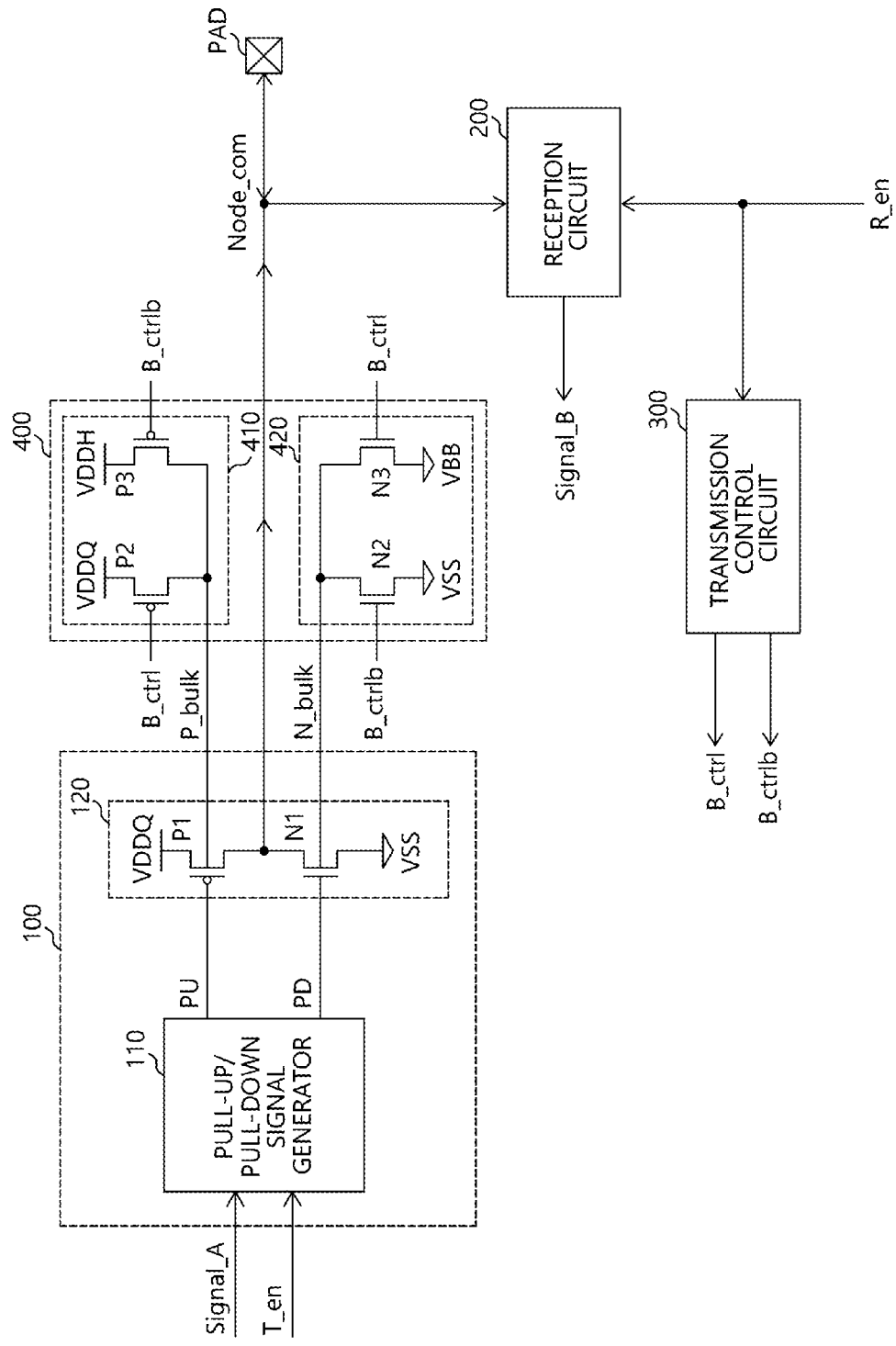
FIG. 1 is a configuration diagram illustrating a representation of an example of a semiconductor apparatus according to an embodiment.

Hereinafter, various examples of embodiments will be described below with reference to the accompanying drawings. Various examples of the embodiments are described herein with reference to cross-sectional illustrations that are schematic illustrations of examples of the embodiments (and intermediate structures). As such, variations from the shapes of the illustrations as a result, for example, of manufacturing techniques and/or tolerances, are to be expected. Thus, various examples of the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The concepts described herein with reference to cross-section and/or plan illustrations that are schematic illustrations of examples of embodiments. However, these examples of the embodiments should not be limited. Although a few embodiments will be illustrated and described, it will be appreciated by those of ordinary skill in the art that changes may be made in these examples of the embodiments without departing from the principles and spirit of the disclosure.

Referring to FIG. 1, a semiconductor apparatus according to an embodiment may include a transmission circuit 100, a reception circuit 200, a transmission control circuit 300, and a bulk control circuit 400.

The transmission circuit 100 may receive a first signal Signal_A and output the received first signal Signal_A to a common node Node_com.

The transmission circuit 100 may include a pull-up/pull-down signal generator 110 and a driver 120.

The pull-up/pull-down signal generator 110 may receive the first signal Signal_A and a transmission enable signal T_en, and generate a pull-up signal PU and a pull-down signal PD in response to the first signal Signal_A and the transmission enable signal T_en. For example, the pull-up/pull-down signal generator 110 may generate the pull-up signal PU and the pull-down signal PD in response to the first signal Signal_A when the transmission enable signal T_en is enabled. In this example, the pull-up/pull-down signal generator 110 may enable the pull-up signal PU and disable the pull-down signal PD when a voltage level of the first signal Signal_A is a first preset level. The pull-up/pull-down signal generator 110 may disable the pull-up signal PU and enable the pull-down signal PD when the voltage level of the first signal Signal_A is a second preset level. The pull-up/pull-down signal generator 110 may disable the pull-up signal PU and the pull-down signal PD when the transmission enable signal T_en is disabled.

The driver 120 may drive the common node Node_com in response to the pull-up signal PU and the pull-down PD signal.

The driver 120 may include first and second transistors P1 and N1. In the first transistor P1, the pull-up signal PU may be input to a gate, an external voltage VDDQ may be input to a source, and a first bulk voltage P_bulk may be input to a bulk bias input terminal. In the second transistor N1, the pull-down signal PD may be input to a gate, a drain may be coupled to a drain of the first transistor P1, a ground voltage VSS may be input to a source, and a second bulk voltage N_bulk may be input to a bulk bias input terminal. A node in which the first and second transistors P1 and N2 are coupled, that is, an output terminal of the driver 120 may be coupled to the common node Node_com, and the common node Node_com may be coupled to a pad PAD. The pad PAD may be configured to be coupled to an external apparatus outside the semiconductor apparatus.

The reception circuit 200 may output a second signal Signal_B by receiving a signal from the common node Node_com in response to a reception enable signal R_en. For example, when the reception enable signal R_en is enabled, the reception circuit 200 may be activated, and output the signal input through the common node Node_com from the pad PAD as the second signal Signal_B. The reception circuit 200 may be inactivated when the reception enable signal R_en is disabled.

The transmission control circuit 300 may generate a bulk control signal B_ctrl and a bulk bar control signal B_ctrlb in response to the reception enable signal R_en. The bulk control signal B_ctrl and the bulk bar control signal B_ctrlb may be signals having different voltage levels. The bulk control signal B_ctrl and the bulk bar control signal B_ctrlb may be signals having opposite signal levels. For example, the transmission control circuit 300 may enable the bulk control signal B_ctrl and disable the bulk bar control signal B_ctrlb when the reception enable signal R_en is enabled. The transmission control signal 300 may disable the bulk control signal B_ctrl and enable the bulk bar control signal B_ctrlb when the reception enable signal R_en is disabled.

The bulk control circuit 400 may generate the first bulk voltage P_bulk and the second bulk voltage N_bulk in response to the bulk control signal B_ctrl and the bulk bar control signal B_ctrlb. For example, the bulk control circuit 400 may output the external voltage VDDQ as the first bulk voltage P_bulk and output the ground voltage VSS as the second bulk voltage N_bulk when the bulk control signal B_ctrl is enabled and the bulk bar control signal B_ctrlb is disabled. In an example, the bulk control circuit 400 may output an external high voltage VDDH as the first bulk voltage P_bulk and output a negative voltage VBB as the second bulk voltage N_bulk when the bulk control signal B_ctrl is disabled and the bulk bar control signal B_ctrlb is enabled. For example, the bulk control circuit 400 may output the first bulk voltage P_bulk having a higher voltage level and the second bulk voltage N_bulk having a lower voltage level when the bulk control signal B_ctrl is disabled and the bulk bar control signal B_ctrlb is enabled than when the bulk control signal B_ctrl is enabled and the bulk bar control signal B_ctrlb is disabled. The external high voltage VDDH may be a voltage having a higher voltage level than the external voltage VDDQ, and the negative voltage VBB may be a voltage having a lower voltage level than the ground voltage VSS.

The bulk control circuit 400 may include a first bulk voltage level selector 410 and a second bulk voltage level selector 420.

The first bulk voltage level selector 410 may output the first bulk voltage P_bulk having the higher voltage level when the bulk control signal B_ctrl is disabled and the bulk bar control signal B_ctrlb is enabled than when the bulk control signal B_ctrl is enabled and the bulk bar control signal B_ctrlb is disabled. For example, the first bulk voltage level selector 410 may selectively output one of the external voltage VDDQ and the external high voltage VDDH as the first bulk voltage P_bulk in response to the bulk control signal B_ctrl and the bulk bar control signal B_ctrlb. For example, the first bulk voltage level selector 410 may output the external voltage VDDQ as the first bulk voltage P_bulk when the bulk control signal B_ctrl is disabled and the bulk bar control signal B_ctrlb is enabled. The first bulk voltage level selector 410 may output the external high voltage VDDH as the first bulk voltage P_bulk when the bulk control signal B_ctrl is enabled and the bulk bar control signal B_ctrlb is disabled.

The first bulk voltage level selector 410 may include third and fourth transistors P2 and P3. In the third transistor P2, the bulk control signal B_ctrl may be input to a gate, and the external voltage VDDQ may be input to a source. In the fourth transistor P3, the bulk bar control signal B_ctrlb may be input to a gate, the external high voltage VDDH may be input to a source, and a drain may be coupled to a drain of the third transistor P2. The first bulk voltage P_bulk may be output at a node to which the drains of the third and fourth transistors P2 and P3 are coupled.

The second bulk voltage level selector 420 may output the second bulk voltage N_bulk having the lower voltage level when the bulk control signal B_ctrl is disabled and the bulk bar control signal B_ctrlb is enabled than when the bulk control signal B_ctrl is enabled and the bulk bar control signal B_ctrlb is disabled. For example, the second bulk voltage level selector 420 may selectively output one of the ground voltage VSS and the negative voltage VBB as the second bulk voltage N_bulk in response to the bulk control signal B_ctrl and the bulk bar control signal B_ctrlb. For example, the second bulk voltage level selector 420 may output the ground voltage VSS as the second bulk voltage N_bulk when the bulk bar control signal B_ctrlb is disabled and the bulk control signal B_ctrl is enabled. The second bulk voltage level selector 420 may output the negative voltage VBB as the second bulk voltage N_bulk when the bulk bar control signal B_ctrlb is enabled and the bulk control signal B_ctrl is disabled.

The second bulk voltage level selector 420 may include fifth and sixth transistors N2 and N3. In the fifth transistor N2, the bulk bar control signal B_ctrlb may be input to a gate, and the ground voltage VSS may be input to a source. In the sixth transistor N3, the bulk control signal B_ctrl may be input to a gate, the negative voltage VBB may be input to a source, and a drain may be coupled to a drain of the fifth transistor N2. The second bulk voltage N_bulk may be output at a node to which the drains of the fifth and sixth transistors N2 and N3 are coupled.

Figure 2:
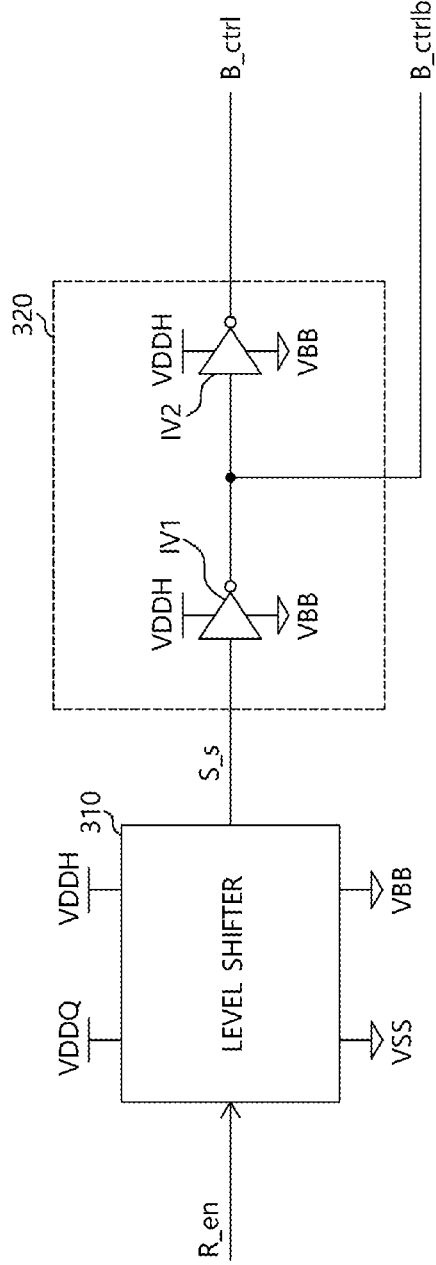
FIG. 2 is a configuration diagram illustrating a representation of an example of a transmission control circuit of FIG. 1.

Referring to FIG. 2, the transmission control circuit 300 may include a level shifter 310 and a bulk control signal output unit 320.

The level shifter 310 may generate a shifting signal S_s having a second switching width larger than a first switching width by level-shifting the reception enable signal R_en having the first swing width. For example, the level shifter 310 may convert the reception enable signal R_en, which may be transited between the voltage level of the ground voltage VSS and the voltage level of the external voltage VDDQ, to the shifting signal S_s which may be transited between the voltage level of the negative voltage VBB and the voltage level of the external high voltage VDDH, and output the shifting signal S_s. The first swing width may be a swing width of a signal which may be transited between the voltage level of the ground voltage VSS and the voltage level of the external voltage VDDQ, and the second swing width may be a swing width of a signal which may be transited between the voltage level of the negative voltage VBB and the voltage level of the external high voltage VDDH.

The bulk control signal output unit 320 may invert the shifting signal S_s and output the inverted shifting signal S_s as the bulk bar control signal B_ctrlb. The bulk control signal output unit 320 may invert the bulk bar control signal B_ctrlb and output the inverted bulk bar control signal as the bulk control signal B_ctrl. Since the bulk control signal B_ctrl is generated by inverting the shifting signal S_s twice, the shifting signal S_s may have the same phase as the bulk control signal B_ctrl. Like the shifting signal S_s, the bulk control signal B_ctrl and the bulk bar control signal B_ctrlb may be signals which may be transited between the voltage level of the negative voltage VBB and the voltage level of the external high voltage VDDH. The bulk control signal B_ctrl may be enabled to the voltage level of the external high voltage VDDH, and disabled to the voltage level of the negative voltage VBB. The bulk bar control signal B_ctrlb may be enabled to the voltage level of the external high voltage VDDH, and disabled to the voltage level of the negative voltage VBB.

The bulk control signal output unit 320 may include first and second inverters IV1 and IV2. The first inverter IV1 may output the bulk bar control signal B_ctrlb by receiving the shifting signal S_s, and receive the external high voltage VDDH and the negative voltage VBB as driving voltages. The second inverter IV2 may output the bulk control signal B_ctrl by receiving the bulk bar control signal B_ctrlb and receive the external voltage VDDH and the negative voltage VBB as driving voltages.

An example of an operation of the semiconductor apparatus having the above-described configuration according to an embodiment will be described with reference to FIG. 1.

An operation of the semiconductor apparatus whereby the transmission circuit 100 outputs the first signal Signal_A to the pad PAD will be described.

When the transmission circuit 100 is operated, the transmission enable signal T_en is enabled and the reception enable signal R_en is disabled.

The reception circuit 200 which receives the disabled reception enable signal R_en may be inactivated and may not perform the reception operation.

The disabled reception enable signal R_en may be input to the transmission control signal 300.

The transmission control circuit 300 may output the disabled bulk control signal B_ctrl and the enabled bulk bar control signal B_ctrlb by receiving the disabled reception enable signal R_en. The disabled bulk control signal B_ctrl may have the voltage level of the negative voltage VBB and the enabled bulk bar control signal B_ctrlb may have the voltage level of the external high voltage VDDH.

The bulk control circuit 400 may receive the disabled bulk control signal B_ctrl and the enabled bulk bar control signal B_ctrlb.

The bulk control circuit 400 may output the first bulk voltage P_bulk which is the voltage level of the external voltage VDDQ and output the second bulk voltage N_bulk which is the voltage level of the ground voltage VSS.

The operation of the bulk control circuit 400 will be described below.

The bulk control circuit 400 may include the first bulk voltage level selector 410 and the second bulk voltage level selector 420.

The first bulk voltage level selector 410 may receive the bulk control signal B_ctrl disabled to the voltage level of the negative voltage VBB, and the bulk bar control signal B_ctrlb enabled to the voltage level of the external high voltage VDDH.

The first bulk voltage level selector 410 may include the third and fourth transistors P2 and P3. The third transistor P2 receiving the disabled bulk control signal B_ctrl may be turned on and output the external voltage VDDQ as the first bulk voltage P_bulk. The fourth transistor P3 receiving the enabled bulk bar control signal B_ctrlb may be turned off.

Accordingly, the first bulk P_bulk having the voltage level of the external voltage VDDQ may be output from the first bulk voltage level selector 410.

The second bulk voltage level selector 420 may receive the bulk control signal B_ctrl disabled to the voltage level of the negative voltage VBB, and the bulk bar control signal B_ctrlb enabled to the voltage level of the external high voltage VDDH.

The second bulk voltage level selector 420 may include the fifth and sixth transistors N2 and N3. The fifth transistor N2 receiving the enabled bulk bar control signal B_ctrlb may be turned on and output the ground voltage VSS as the second bulk voltage N_bulk. The sixth transistor N3 receiving the disabled bulk control signal B_ctrl may be turned off.

Accordingly, the second bulk N_bulk having the voltage level of the ground voltage VSS may be output from the second bulk voltage level selector 420.

The transmission circuit 100 may include the pull-up/pull-down signal generator 110 and the driver 120.

In a state when the transmission enable signal T_en is enabled, the pull-up/pull-down signal generator 110 may enable the pull-up signal PU when the voltage level of the first signal Signal_A is a first preset level and enable the pull-down signal PD when the voltage level of the first signal Signal_A is a second preset level. For example, when the transmission enable signal T_en is enabled, the pull-up/pull-down signal generator 110 may enable one of the pull-up signal PU and the pull-down signal PD in response to the first signal Signal_A. When the transmission enable signal T_en is disabled, the pull-up/pull-down signal generator 110 may disable both the pull-up signal PU and the pull-down signal PD.

The driver 120 may pull-up drive the common node Node_com by receiving the enabled pull-up signal PU, and pull-down drive the common node Node_com by receiving the enabled pull-down signal PD. The first transistor P1 constituting the driver 120 may be turned on by receiving the enabled pull-up signal PU, which is the voltage level of the ground voltage VSS, through the gate and may pull-up drive the common node Node_com in a state when the external voltage VDDQ is input to the source of the first transistor P1 and the first bulk voltage P_bulk, which is the voltage level of the external voltage VDDQ, is input to the bulk bias input terminal thereof. The second transistor N1 constituting the driver 120 may be turned on by receiving the enabled pull-down signal PD, which is the voltage level of the external voltage VDDQ, through the gate and may pull-down drive the common node Node_com in a state that the ground voltage VSS is input to the source of the second transistor N1 and the second bulk voltage N_bulk, which is the voltage level of the ground voltage VSS, is input to the bulk bias input terminal thereof.

For example, when the driver 120 pull-up drives or pull-down drives the common node Node_com in response to the pull-up signal PU and the pull-down signal PD, the first transistor P1 constituting the driver 120 may receive the voltage having the same voltage level as the source, that is, the external voltage VDDQ through the bulk bias input terminal, and the second transistor N1 constituting the driver 120 may receive the voltage having the same voltage level as the source, that is, the ground voltage VSS through the bulk bias input terminal.

The transmission circuit 100 may output the first signal Signal_A to the pad PAD through the common node Node_com through the above-described operation.

An example of an operation of the semiconductor apparatus where the reception circuit 200 outputs a signal received from the pad PAD as the second signal Signal_B will be described.

When the reception circuit 200 is operated, the reception enable signal R_en is enabled, and the transmission enable signal T_en is disabled.

The transmission circuit 100 which receives the disabled transmission enable signal T_en may be inactivated and may not perform the transmission operation. For example, the pull-up/pull-down signal generator 110 of the transmission circuit 100 may disable the pull-up signal PU and the pull-down signal PD when the transmission enable signal T_en is disabled. The first transistor P1 and the second transistor N1 of the driver 120 may be turned off by receiving the disabled pull-up signal PU and the disabled pull-down signal PD. Accordingly, the driver 120 may not drive the common node Node_com.

The reception circuit 200 may be activated by receiving the enabled reception enable signal R_en, the signal received from the pad PAD is input to the reception circuit 200 through the command node Node_com, and the reception circuit 200 may output the signal received from the pad PAD as the second signal Signal_B.

The reception control circuit 300 may generate the enabled bulk control signal B_ctrl and the disabled bulk bar control signal B_ctrlb by receiving the reception enable signal R_en which is enabled. The enabled bulk control signal B_ctrl may have the voltage level of the external high voltage VDDH, and the disabled bulk bar control signal B_ctrlb may have the voltage level of the negative voltage VBB.

The bulk control circuit 400 may receive the enabled bulk control signal B_ctrl and the disabled bulk bar control signal B_ctrlb.

The bulk control circuit 400 may output the first bulk voltage P_bulk which is the voltage level of the external high voltage VDDH, and output the second bulk voltage N_bulk which is the voltage level of the negative voltage VBB.

The operation of the bulk control circuit 400 will be described below.

The first bulk voltage level selector 410 may receive the bulk control signal B_ctrl enabled to the voltage level of the external high voltage VDDH and the bulk bar control signal B_ctrlb disabled to the voltage level of the negative voltage VBB.

The first bulk voltage level selector 410 may be configured of the third and fourth transistors P2 and P3. The third transistor P2 which receives the enabled bulk control signal B_ctrl may be turned off, and the fourth transistor P3 which receives the disabled bulk bar control signal B_ctrlb may be turned on and output the external high voltage VDDH as the first bulk voltage P_bulk.

Therefore, the first bulk voltage P_bulk having the voltage level of the external high voltage VDDH may be output from the first bulk voltage level selector 410.

The second bulk voltage level selector 420 may receive the bulk control signal B_ctrl enabled to the voltage level of the external high voltage VDDH and the bulk bar control signal B_ctrlb disabled to the voltage level of the negative voltage VBB.

The second bulk voltage level selector 420 may be configured of the fifth and sixth transistors N2 and N3. The fifth transistor N2 which receives the disabled bulk bar control signal B_ctrlb may be turned off, and the sixth transistor N3 which receives the enabled bulk control signal B_ctrl may be turned on and output the negative voltage VBB as the second bulk voltage N_bulk.

Therefore, the second bulk N_bulk having the voltage level of the negative voltage VBB may be output from the second bulk voltage level selector 420.

The first transistor P1 constituting the driver 120 may receive the external high voltage VDDH, which has the higher voltage level than the external voltage VDDQ applied to the source thereof, as the first bulk voltage P_bulk through the bulk bias input terminal in a turn-off state. The second transistor N1 constituting the driver 120 may receive the negative voltage VBB, which has the lower voltage level than the ground voltage VSS applied to the source thereof, as the second bulk voltage N_bulk through the bulk bias input terminal in a turn-off state.

For example, the first transistor P1 may receive the external high voltage VDDH, which has the higher voltage level than the external voltage VDDQ applied to the source thereof, through the bulk bias input terminal in the state that the first transistor P1 is turned off by receiving the pull-up signal PU disabled to the high level, that is, the voltage level of the external voltage VDDQ through the gate. The junction capacitance of the first transistor P1 may be reduced when the voltage having the higher voltage level than the voltage level applied to the source thereof is input to the bulk bias input terminal rather than when the voltage having the same voltage level as the voltage level applied to the source thereof is input to the bulk bias input terminal.

The first transistor P1 constituting the driver 120 may receive the external high voltage VDDH, which has the higher voltage than the external voltage VDDQ applied to the source thereof, as the first bulk voltage P_bulk through the bulk bias input terminal in the turn-off state. The second transistor N1 constituting the driver 120 may receive the negative voltage VBB, which has the lower voltage level than the ground voltage VSS applied to the source thereof, as the second bulk voltage N_bulk through the bulk bias input terminal in the turn-off state.

For example, the second transistor N1 may receive the negative voltage VBB, which has the lower voltage level than the ground voltage VSS applied to the source thereof, through the bulk bias input terminal in the state that the second transistor N1 is turned off by receiving the pull-down signal PD disabled to the low level, that is, the voltage level of the ground voltage VSS through the gate. The junction capacitance of the second transistor N1 may be reduced when the voltage having the lower voltage level than the voltage level applied to the source thereof is input to the bulk bias input terminal rather than when the voltage having the same voltage level as the voltage level applied to the source thereof is input to the bulk bias input terminal.

Figure 3:
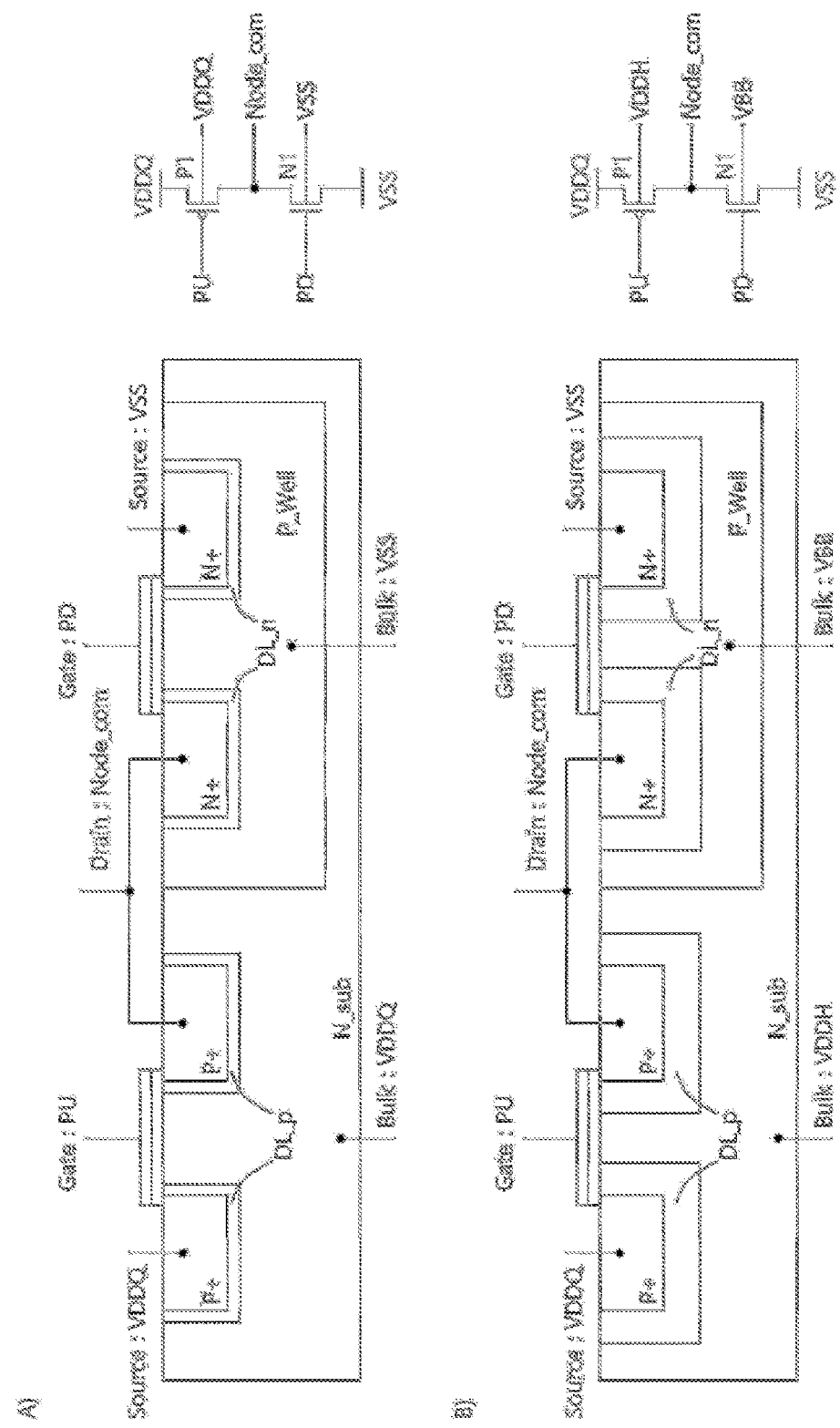
FIG. 3 is a cross-sectional diagram illustrating a representation of an example of a semiconductor apparatus according to an embodiment.

The junction capacitances of the transistors P1 and N1 constituting the driver 120 will be described below with reference to FIG. 3.

FIG. 3(A) illustrates a cross-section view when the semiconductor apparatus performs the transmission operation. When the semiconductor apparatus performs the transmission operation as described above, the first transistor P1 of the driver 120 may receive the first bulk voltage P_bulk which is the voltage level of the external voltage VDDQ through a bulk bias input terminal Bulk, and the second transistor N1 may receive the second bulk voltage N_bulk which is the voltage level of the ground voltage VSS through a bulk bias input terminal Bulk.

FIG. 3(B) illustrates a cross-section view when the semiconductor apparatus performs the reception operation. When the semiconductor apparatus performs the reception operation as described above, the first transistor P1 of the driver 120 may receive the first bulk voltage P_bulk which is the voltage level of the external high voltage VDDH through the bulk bias input terminal Bulk, and the second transistor N1 may receive the second bulk voltage N_bulk which is the voltage level of the negative voltage VBB through the bulk bias input terminal Bulk.

When the semiconductor apparatus performs the transmission operation A and the reception operation B, of the first transistor P1 in the transmission operation A and the reception operation B, a source Source may receive the external voltage VDDQ, a gate Gate may receive the pull-up signal PU, and a drain Drain may be coupled to the common node Node_com. Similarly, of the second transistor N1 in the transmission operation A and the reception operation B, a drain Drain may be coupled to the common node Node_com, a gate Gate may receive the pull-down signal PD, and a source Source may receive the ground voltage VSS.

The first transistor P1 and the second transistor N1 in the transmission operation and the reception operation may be different in that the voltages input to the bulk bias input terminals Bulk of the first transistor P1 and the second transistor N1 may be changed.

A depletion layer DL_p may be formed between a source region P and a drain region P of the first transistor P1 and an N-type substrate N_sub, and a depletion layer DL_n may be formed between a source region N and a drain region N of the second transistor N1 and a P type well P_well.

The depletion layer DL_p of the first transistor P1 may be widened when the external high voltage VDDH, which is higher than the external voltage VDDQ applied to the source thereof, is input to the bulk bias input terminal Bulk in the first transistor P1 rather than when the external voltage VDDQ, which is the same voltage level as the voltage level applied to the source thereof, is input to the bulk bias input terminal Bulk in the first transistor P1.

The depletion layer DL_N of the second transistor N1 may be widened when the negative voltage VBB, which is lower than the ground voltage VSS applied to the source thereof, is input to the bulk bias input terminal Bulk in the second transistor N1 rather than when the ground voltage VSS, which has the same voltage level as the voltage level applied to the source thereof, is input to the bulk bias input terminal BULK in the second transistor N1.

That is, it can be seen that the depletion layers DL_P and DL_n of the first and second transistors P1 and N1 constituting the driver of the semiconductor apparatus according to an embodiment may be more widened when the semiconductor apparatus performs the reception operation rather than when the semiconductor apparatus performs the transmission operation. As the depletion layers are widened, the junction capacitances of the first and second transistors P1 and N1 may be reduced.

In the semiconductor apparatus according to an embodiment, the transmission circuit, the reception circuit, and the pad may be coupled to one common node. The junction capacitances of the transistors constituting the driver out of the parasitic capacitance of a line to which the transmission circuit, the reception circuit, and the pad are coupled may be varied. That is, the parasitic capacitance may be reduced by further reducing the junction capacitances of the transistors constituting the driver of the transmission circuit in the reception operation rather than the transmission operation. Therefore, total capacitance between the pad and the reception circuit may be reduced. Accordingly, the semiconductor apparatus according to an embodiment may be advantageous to receive a signal input at high speed.

Figure 4:
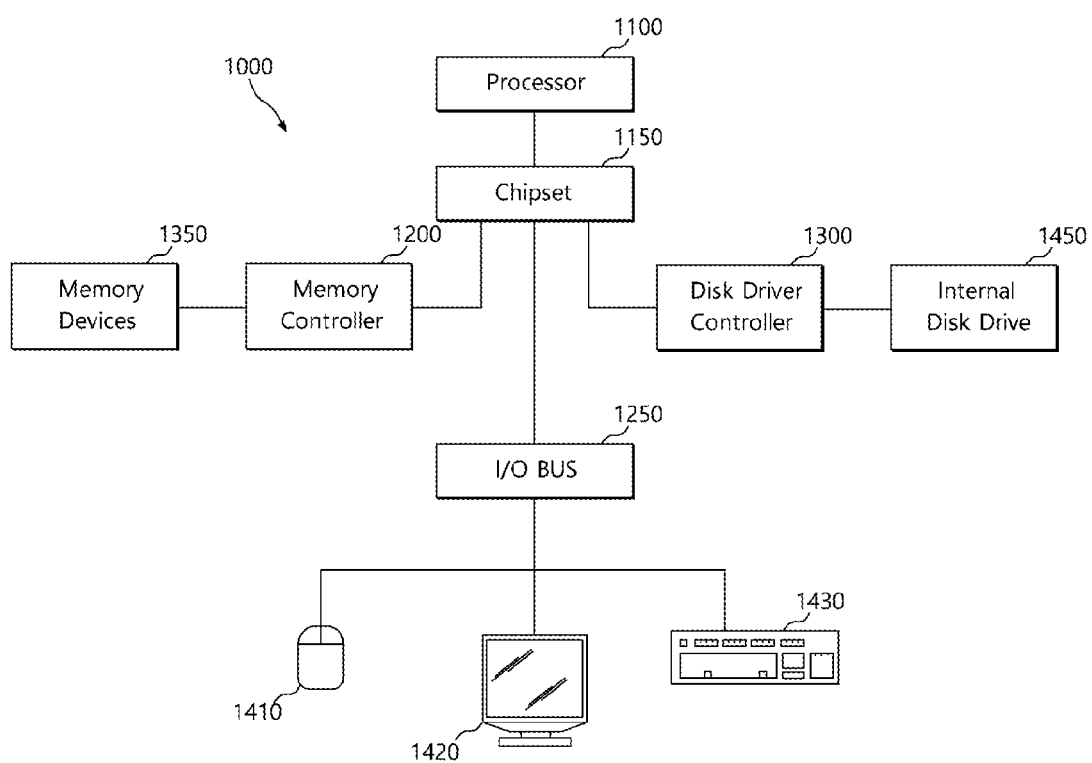
FIG. 4 illustrates a block diagram of an example of a representation of a system employing a semiconductor apparatus in accordance with the various embodiments discussed above with relation to FIGS. 1-3.

The semiconductor apparatus discussed above (see FIGS. 1-3) are particular useful in the design of memory devices, processors, and computer systems. For example, referring to FIG. 4, a block diagram of a system employing a semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor apparatus as discussed above with relation to FIGS. 1-3. In alternate embodiments, such as, for example but not limited to, cellular phones or digital cameras, the components may differ from the embodiments illustrated in FIG. 4.

The above embodiments are illustrative and not limitative. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor apparatus comprising:
   a transmission circuit;
   a reception circuit;
   a pad commonly coupled to the transmission circuit and the reception circuit, and
   a transmission control circuit configured to generate a bulk control signal in a reception enable signal,
   wherein parasitic capacitance of a line coupled to the transmission circuit, the reception circuit, and the pad is varied in response to the bulk control signal,
   wherein the reception circuit is activated in response to the reception enable signal,
   wherein the transmission control circuit includes:
   a level shifter configured to level-shift the reception enable signal and output the level-shifted reception enable signal as a shifting signal; and
   a bulk control signal output unit configured to generate the bulk control signal in response to the shifting signal.

2. The semiconductor apparatus of claim 1, wherein the parasitic capacitance is reduced when the reception circuit is activated rather than when the transmission circuit is activated.

3. The semiconductor apparatus of claim 2, wherein the transmission circuit includes a driver including a first transistor and a second transistor, and
   junction capacitances of the first and second transistors are reduced when the reception circuit is activated rather than when the transmission circuit is activated.

4. The semiconductor apparatus of claim 3, wherein a level of a voltage input to a source and a level of a voltage input to a bulk bias input terminal in each of the first and second transistors are changed when the reception circuit is activated rather than when the transmission circuit is activated.

5. The semiconductor apparatus of claim 4, wherein the level of the voltage input to the bulk bias input terminal in the first transistor is increased when the reception circuit is activated rather than when the transmission circuit is activated.

6. The semiconductor apparatus of claim 5, wherein an external voltage is input to the bulk bias input terminal of the first transistor when the transmission circuit is activated, and an external high voltage is input to the bulk bias input terminal of the first transistor when the reception circuit is activated.

7. The semiconductor apparatus of claim 6, wherein the external high voltage has a higher voltage level than the external voltage.

8. The semiconductor apparatus of claim 4, wherein the level of the voltage input to the bulk bias input terminal in the second transistor is reduced when the reception circuit is activated rather than when the transmission circuit is activated.

9. The semiconductor apparatus of claim 8, wherein a ground voltage is input to the source and the bulk bias input terminal of the second transistor when the transmission circuit is activated, and the ground voltage is input to the source of the second transistor and a negative voltage is input to the bulk bias input terminal of the second transistor when the reception circuit is activated.

10. The semiconductor apparatus of claim 9, wherein a voltage level of the negative voltage is lower than a voltage level of the ground voltage.

11. A semiconductor apparatus comprising:
    a transmission circuit and a reception circuit commonly coupled to a pad through a line;
    a transmission control circuit configured to generate a bulk control signal in response to a reception enable signal; and
    a bulk control circuit configured to generate a first bulk voltage and a second bulk voltage in response to the bulk control signal,
    wherein the first bulk voltage and the second bulk voltage are provided to the transmission circuit,
    wherein the reception circuit is activated in response to the reception enable signal,
    wherein the transmission control circuit includes:
    a level shifter configured to level-shift the reception enable signal and output the level-shifted reception enable signal as a shifting signal; and
    a bulk control signal output unit configured to generate the bulk control signal in response to the shifting signal.

12. The semiconductor apparatus of claim 11, wherein the transmission control circuit enables the bulk control signal when the reception circuit is activated, and
    the transmission control circuit disables the bulk control signal when the transmission circuit is activated.

13. The semiconductor apparatus of claim 12, wherein the transmission control circuit generates the bulk control signal in response to the reception enable signal activating the reception circuit.

14. The semiconductor apparatus of claim 11, wherein the bulk control circuit includes:
    a first bulk voltage level selector configured to output one of an external voltage and an external high voltage as the first bulk voltage in response to the bulk control signal; and
    a second bulk voltage level selector configured to output one of a ground voltage and a negative voltage as the second bulk voltage in response to the bulk control signal.

15. The semiconductor apparatus of claim 14, wherein the first bulk voltage level selector outputs the external voltage as the first bulk voltage when the bulk control signal is disabled, and outputs the external high voltage as the first bulk voltage when the bulk control signal is enabled.

16. The semiconductor apparatus of claim 14, wherein the second bulk voltage level selector outputs the ground voltage as the second bulk voltage when the bulk control signal is disabled, and outputs the negative voltage as the second bulk voltage when the bulk control signal is enabled.

17. The semiconductor apparatus of claim 11, wherein the transmission circuit includes a driver including a first transistor and a second transistor,
  a pull-up signal is input to a gate of the first transistor, an external voltage is input to a source of the first transistor, a pad is coupled to a drain of the first transistor, and the first bulk voltage is input to a bulk bias input terminal of the first transistor, and
  a pull-down signal is input to a gate of the second transistor, a ground voltage is input to a source of the second transistor, the pad is coupled to a drain of the second transistor, and the second bulk voltage is input to a bulk bias input terminal of the second transistor.

18. A semiconductor apparatus comprising:
  a transmission circuit including a driver, the driver including a transistor;
  a reception circuit;
  a pad commonly coupled to the transmission circuit and the reception circuit through a line; and
  a transmission control circuit configured to generate a bulk control signal in response to a reception enable signal,
  wherein a junction capacity of the transistor is reduced in response to a reception enable signal,
  wherein the reception circuit is activated in response to the reception enable signal,
  wherein the transmission control circuit includes:
    a level shifter configured to level-shift the reception enable signal and output the level-shifted reception enable signal as a shifting signal; and
    a bulk control signal output unit configured to generate the bulk control signal in response to the shifting signal.

19. The semiconductor apparatus of claim 18, wherein a depletion layer of the transistor is widened more when the reception circuit is activated than when the transmission circuit is activated,
  wherein the semiconductor apparatus further comprises a transmission control circuit configured to reduce the junction capacity of the transistor by widening the depletion layer of the transistor when the reception circuit is activated and a bulk control circuit configured to receive a bulk control signal from the transmission control circuit and apply a bulk voltage to a bulk bias input terminal of the transistor.

* * * * *